(12) United States Patent
Zhao et al.

(10) Patent No.: US 10,971,564 B2
(45) Date of Patent: Apr. 6, 2021

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Pan Zhao, Beijing (CN); Zhiliang Jiang, Beijing (CN); Ge Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 16/520,784

(22) Filed: Jul. 24, 2019

(65) Prior Publication Data

US 2020/0152716 A1     May 14, 2020

(30) Foreign Application Priority Data

Nov. 8, 2018   (CN) .......................... 201811325086.X

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 27/3258* (2013.01); *H01L 51/524* (2013.01); *H01L 51/525* (2013.01); *H01L 51/56* (2013.01)

(58) Field of Classification Search
CPC ............. H01L 27/3246; H01L 27/3295; H01L 27/3258; H01L 51/56; H01L 51/5237–525
See application file for complete search history.

(56) References Cited

U.S. PATENT DOCUMENTS 9,095,018 B2 * 7/2015 Masuda .............. H01L 51/5246
9,450,034 B2   9/2016 Lee et al.
(Continued)

FOREIGN PATENT DOCUMENTS

CN   104517999 A    4/2015
CN   106158881 A   11/2016
(Continued)

OTHER PUBLICATIONS

First Chinese Office Action from corresponding Chinese Patent Application No. 201811325086.X dated Jun. 30, 2020.

*Primary Examiner* — Marceli Santiago
(74) *Attorney, Agent, or Firm* — Dilworth & Barrese, LLP.; Michael J. Musella, Esq.

(57) ABSTRACT

Disclosed are a display panel, a manufacturing method thereof, and a display device. The display panel includes a base substrate, the base substrate including a display region and a border region surrounding the display region, wherein the border region includes a specially-shaped border region; a first barrier structure configured to be disposed in at least the specially-shaped border region; and at least one second barrier structure configured to be disposed only in the specially-shaped border region.

17 Claims, 5 Drawing Sheets

(56) References Cited

U.S. PATENT DOCUMENTS

| | | | |
|---|---|---|---|
| 10,490,773 B2 | 11/2019 | Kim | |
| 2011/0249376 A1* | 10/2011 | Wu | H05K 1/181 |
| | | | 361/679.01 |
| 2017/0351150 A1* | 12/2017 | Li | G02F 1/133351 |
| 2018/0294434 A1 | 10/2018 | Niu et al. | |
| 2019/0280246 A1 | 9/2019 | Cheng | |
| 2019/0363145 A1* | 11/2019 | Ohta | H05B 33/06 |
| 2019/0363275 A1* | 11/2019 | Ochi | H05B 33/04 |

FOREIGN PATENT DOCUMENTS

| | | | |
|---|---|---|---|
| CN | 106206987 A | | 12/2016 |
| CN | 107170792 A | | 9/2017 |
| CN | 207116481 U | | 3/2018 |
| CN | 208045503 U | * | 11/2018 |
| CN | 108962953 A | | 12/2018 |
| WO | 2018179308 A1 | | 10/2018 |

\* cited by examiner

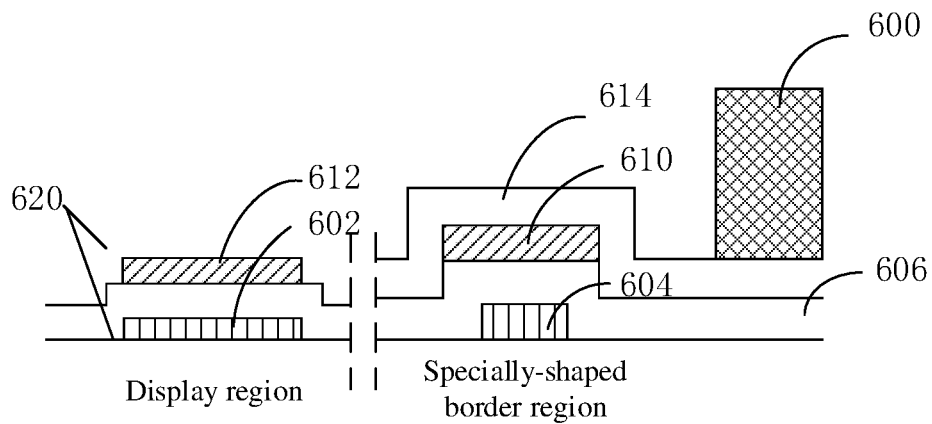

FIG. 6(d)

```
┌─────────────────────────────────────────────────────────────┐
│ Providing a base substrate, wherein the base substrate      │
│ comprises a display region and a border region surrounding  │
│ the display region, and the border region comprises a       │
│ specially-shaped border region                              │
└─────────────────────────────────────────────────────────────┘
                              │
┌─────────────────────────────────────────────────────────────┐
│ Forming a first barrier structure in at least the           │
│ specially-shaped border region                              │
└─────────────────────────────────────────────────────────────┘
                              │
┌─────────────────────────────────────────────────────────────┐
│ Forming at least one second barrier structure only in the   │
│ specially-shaped border region                              │
└─────────────────────────────────────────────────────────────┘
```

FIG. 7

DISPLAY PANEL, MANUFACTURING METHOD THEREOF, AND DISPLAY DEVICE

CROSS REFERENCE TO RELATED APPLICATION

This application is based on and claims the priority of Chinese patent application No. 201811325086.X, entitled "DISPLAY PANEL AND DISPLAY DEVICE" and filed on Nov. 8, 2018, the disclosure of which is incorporated herein by reference in its entirety as a part of this application.

TECHNICAL FIELD

Embodiments of the present disclosure relate to a display panel, a manufacturing method thereof, and a display device comprising the display panel.

BACKGROUND

In the packaging process of a display device such as an active matrix organic light-emitting device (AMOLED), ink-jet printing is usually performed using a printing equipment to form an organic material layer in a packaging structure, and if overflow of printing ink occurs, normal display and/or display quality of the display device will be affected.

SUMMARY

According to an aspect of the present disclosure, there is provided a display panel, comprising: a base substrate, comprising a display region and a border region surrounding the display region, wherein the border region comprises a specially-shaped border region; a first barrier structure configured to be disposed in at least the specially-shaped border region; and at least one second barrier structure configured to be disposed only in the specially-shaped border region.

According to another aspect of the present disclosure, there is further provided a method of manufacturing a display panel, comprising: providing a base substrate, wherein the base substrate comprises a display region and a border region surrounding the display region, and the border region comprises a specially-shaped border region; forming a first barrier structure in at least the specially-shaped border region; and forming at least one second barrier structure only in the specially-shaped border region.

According to yet another aspect of the present disclosure, there is further provided a display device. The display device comprises the display panel described in any one of the above embodiments.

BRIEF DESCRIPTION OF THE DRAWINGS

In order to explain the technical solutions of the embodiments of the present disclosure more clearly, the drawings of the embodiments will be briefly introduced below. Obviously, the drawings described below only refer to some embodiments of the present disclosure, and are not limitative of the present disclosure.

FIG. 6(a) to FIG. 6(d) schematically illustrate various steps of a method of manufacturing a display panel according to embodiments of the present disclosure; and FIG. 7 schematically illustrates a flowchart of a method of manufacturing a display panel according to embodiments of the present disclosure.

DETAILED DESCRIPTION

Figure 1:
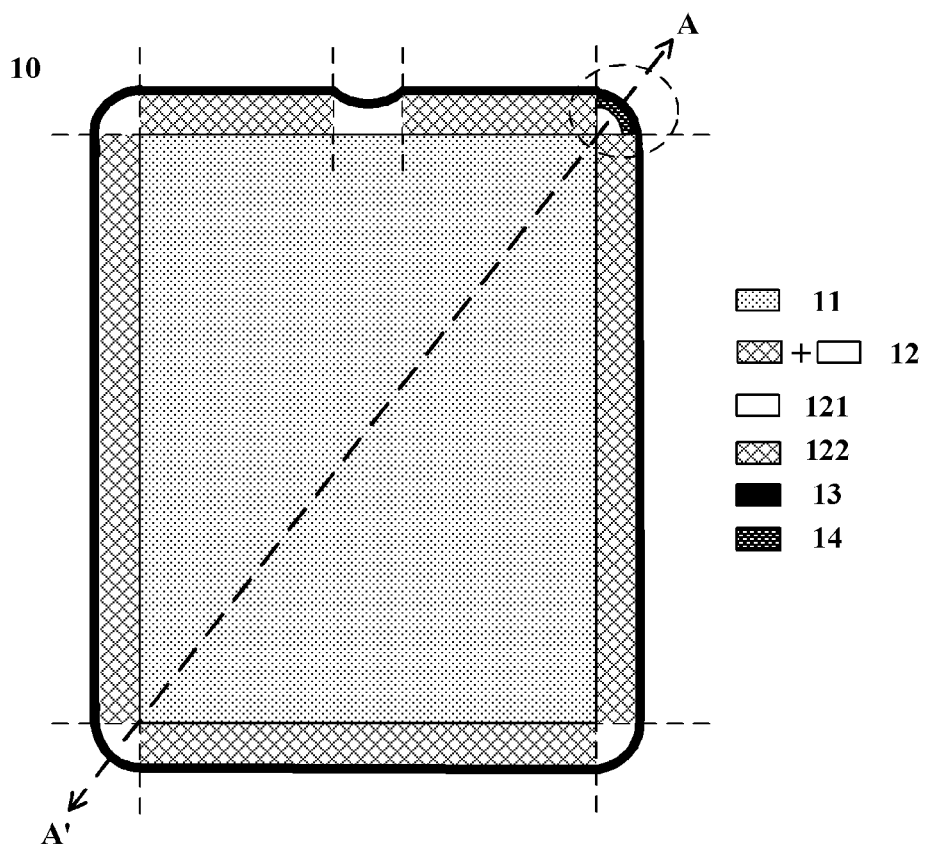
FIG. 1 schematically illustrates a top view of a display panel according to embodiments of the present disclosure.

In order to make the objects, technical solutions and advantages of the embodiments of the present disclosure clearer, the technical solutions of the embodiments of the present disclosure will be described clearly and completely with reference to the drawings of the embodiments of the present disclosure. Apparently, the embodiments described are just part but not all of the embodiments of the present disclosure. Based on the embodiments described herein, the other embodiments obtained by a person of ordinary skill in the art without any inventive work should be within the scope of protection of the present disclosure.

Unless otherwise defined, the technical terms or scientific terms used herein should have the same meanings as commonly understood by one of ordinary skill in the art to which the present disclosure belongs. The terms "first," "second," and the like which are used in the description and the claims of the patent application of the present disclosure are not intended to indicate any sequence, amount or importance, but to distinguish various components. The terms "comprise," "comprising," "include," "including," and the like are intended to specify that the elements or the objects stated before these terms encompass the elements or the objects and equivalents thereof listed after these terms, and do not preclude the other elements or objects. The terms "connect", "connected," and the like are not intended to define physical connection or mechanical connection, but may include electrical connection, directly or indirectly. "Above," "below," "left," "right" and the like are only used to indicate a relative position relationship, and if the absolute position of the object described is changed, the relative position relationship may be changed accordingly.

In general, in the process of manufacturing an organic light-emitting display, it is often necessary to use a packaging structure to package the light-emitting part and display part so as to prevent water and oxygen in the outside air from damaging the organic light-emitting display. Typically, such a packaging structure has a low transmittance to water and oxygen. As a specific implementation, in the organic light-emitting display, a three-layer packaging structure is often used, which is formed by stacking an inorganic material layer, an organic material layer and an inorganic material layer. In the process of forming such a three-layer packaging structure, for example, the organic material layer located in the middle is generally obtained by direct ink-jet printing by means of a printing equipment. However, in actual production, due to the limitations of process conditions and the shape of the display panel in the display, during the process of forming the organic material layer in the three-layer packaging structure, the printing ink overflows easily, for example, to the outside of the entire display panel. Moreover, such overflow of printing ink in the ink-jet printing process occurs particularly easily in the specially-shaped border region of the display panel. Once such overflow occurs, an infiltration channel formed by the overflowing printing ink will be formed in, for example, the specially-shaped border region of the display panel, so that water and/or oxygen in the outside air can easily intrude into the interior of the display panel through such a channel. Finally, because of unfavorable intrusion of water and/or oxygen, the display panel and the corresponding display device may not normally display a picture or exhibit a relatively poor display effect.

Therefore, a barrier structure arranged along the edge of the display panel is proposed in order to block unfavorable overflow of printing ink. In terms of the manufacturing process, the barrier structure arranged along the edge of the entire display panel is generally formed uniformly using the same material in the same manufacturing process. This means that the barrier structures tend to have the same height and width at different positions along the edges of the display panel. Therefore, for printing ink, portions of the barrier structure located at different positions along the edge have the same level of barrier or blocking ability.

However, for regular border regions of the display panel (e.g., regions near side edges, bottom edges, and/or top edges), printing ink generally flows in a direction perpendicular to the corresponding side edges, bottom edges, and/or top edges of the display panel during, for example, direct ink-jet printing of organic materials; in contrast, for irregular border regions (for example, regions near the four circular arc-shaped corners), there will often be printing ink flowing in multiple directions, and this will lead to accumulation of more printing ink, which may readily result in overflow.

The embodiments of the present disclosure provide a display panel, a manufacturing method thereof, and a display device, which are particularly helpful to eliminate or at least alleviate one or more of the above-mentioned problems or defects.

For example, the embodiments of the present disclosure provide a display panel, comprising: a base substrate, comprising a display region and a border region surrounding the display region, herein, the border region comprises a specially-shaped border region; a first barrier structure configured to be disposed in at least the specially-shaped border region; and at least one second barrier structure configured to be disposed only in the specially-shaped border region.

In the display panel of the above embodiments, because the second barrier structure is arranged in the specially-shaped border region to form a double barrier, the ability of the specially-shaped border region to block overflow of liquids such as ink is enhanced, thereby ensuring the normal display of the display panel.

For example, FIG. 1 illustrates a top view of a display panel according to the embodiments of the present disclosure. The display panel 10 comprises a base substrate (not shown), the base substrate comprising a display region 11 located at the center and a border region 12 surrounding the display region 11. The border region 12 further comprises specially-shaped border regions 121 and non-specially-shaped border regions 122. As can be seen from FIG. 1, the specially-shaped border regions 121 of the display panel 10 refer to, for example, border regions near the four circular arc-shaped corners of the display panel 10, or non-specially-shaped border regions introduced due to, for example, the arrangement of components such as cameras (such as, in FIG. 1, irregular shape regions caused by indentation at the center position of the top of the display panel 10). As an example, in the display panel 10 of FIG. 1, five specially-shaped border regions 121 are schematically illustrated, of which four are respectively located at four corners of the display panel 10 and the fifth is located at the center position of the top edge of the base substrate. Obviously, a person skilled in the art should readily appreciate that in the border region 12 of the display panel 10 provided by the embodiments of the present disclosure, any suitable number of specially-shaped border regions 121 may be comprised in addition to the five specially-shaped border regions depicted above as examples, and the present disclosure is intended to cover all these equivalent implementations. Similarly, it can be further seen from FIG. 1 that in the border region 12 of the display panel 10, except for the indicated specially-shaped border regions 121, other regions may all be referred to as non-specially-shaped border regions 122. For example, in the display panel 10 illustrated in FIG. 1, the non-specially-shaped border regions 122 are composed of five rectangular border regions, herein, two adjacent non-specially-shaped border regions 122 (i.e., regular rectangular border regions) are at least partially separated by a corresponding specially-shaped border region 121. Similarly, in combination with the above-mentioned specially-shaped border regions 121, a person skilled in the art will be able to flexibly set any suitable number of non-specially-shaped border regions 122 in the border region 12 of the display panel 10 according to actual needs, and the present disclosure is intended to cover all such equivalent technical solutions.

With further reference to FIG. 1, in the embodiments of the present disclosure, the display panel 10 may further comprise a first barrier structure 13 and a second barrier structure 14. For example, the first barrier structure 13 and the second barrier structure 14 are disposed parallel to the edge of the display panel 10 (e.g., the edge of the base substrate thereof). For example, the first barrier structure 13 is formed at least in the specially-shaped border regions 121 of the display panel 10. As illustrated in FIG. 1, the first barrier structure 13 may be formed in the border region 12 of the entire display panel 10, that is, not only in the specially-shaped border regions 121, but also in the non-specially-shaped border regions 122. However, in the display panel 10 according to the embodiments of the present disclosure, unlike the first barrier structure 13, the second barrier structure 14 is formed only in the specially-shaped border regions 121 of the display panel 10, for example, in the specially-shaped border regions 121 located at one of the corners (located at the upper right corner as illustrated in FIG. 1). Optionally, the second barrier structure 14 is also designed to be further away from the edge of the display panel 10 (e.g., the edge of the base substrate thereof) than the first barrier structure 13, i.e., the second barrier structure 14 is closer to the central display region 11 of the display panel 10 than the first barrier structure 13.

Next, with reference to FIG. 2(a), FIG. 2(b) and FIG. 2(c) which schematically illustrate partial zoomed-in views of the specially-shaped border region 121 of the display panel 10 in FIG. 1, respectively, further details will be given as to how the barrier structure in the display panel according to the embodiments of the present disclosure is used to block, for example, overflow of printing ink during the ink-jet printing process, especially overflow in the specially-shaped border region.

As mentioned above, unlike regular border regions such as straight edge regions, in irregular or specially-shaped border regions, printing ink tends to flow toward the edges of the display panel in a plurality of different directions. For example, as schematically illustrated in FIG. 2(a), FIG. 2(b) and FIG. 2(c), the printing ink (indicated by black dots in the figures) mainly flows to the edges of the display panel in three directions, herein, the first direction is parallel to the top edge of the display panel, the second direction is parallel to the side edge of the display panel, and the third direction is along the radial direction of the circular arc-shaped corner. As such, it can be seen that compared with the case in the non-specially-shaped border region (in which all printing ink flows to the edges of the display panel perpendicular to the straight edge), in the irregular border region such as circular arc-shaped region, more printing ink will flow to the circular arc-shaped edge of the display panel due to the flow in multiple directions. Therefore, the barrier structure at the edge of the display panel (e.g., the first barrier structures 13, 13', 13" in the figures, for example, the outer edge of the first barrier structure is disposed to completely coincide with the edge of the display panel) has a blocking effect on the printing ink in the specially-shaped border region. Further, by arranging another barrier structure (e.g., the second barrier structures 14, 14', 14", 14''') parallel to the circular arc-shaped edge in the irregular border region such as circular arc-shaped region, the double blocking effect on the printing ink in the specially-shaped border region is effectively ensured. Moreover, because of the circular arc-shaped design of the second barrier structures 14, 14', 14", 14''', printing ink flowing in three directions can be well blocked. In such a case, the possibility of printing ink overflowing in the specially-shaped border region during, for example, the ink-jet printing process, is greatly avoided or reduced.

Further, in order to enhance the blocking effect of the barrier structure on printing ink, in other embodiments of the present disclosure, a greater number of second barrier structures may be provided. For example, as illustrated in FIG. 2(b), in addition to the first barrier structure 13' and the second barrier structure 14' similar to the first barrier structure 13 and the second barrier structure 14 in FIG. 2(a), respectively, the display panel may further comprise another second barrier structure 14", which is disposed parallel to the original second barrier structure 14' (and thus parallel to the circular arc-shaped edge of the display panel) in the specially-shaped border region. Of course, a person skilled in the art should be able to appreciate that in different embodiments, the display panel may further comprise any other suitable number of second barrier structures, and all of these technical solutions should fall within the scope of protection of the present disclosure.

Figure 2A:
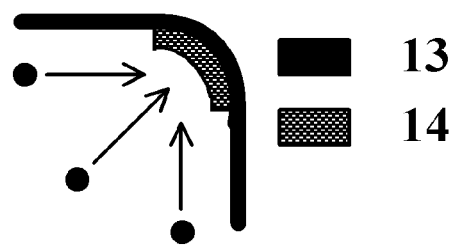
FIG. 2(a), FIG. 2(b) and FIG. 2(c) schematically illustrate partially zoomed-in views of a specially-shaped border region of the display panel in FIG. 1 according to embodiments of the present disclosure.
Figure 2B:
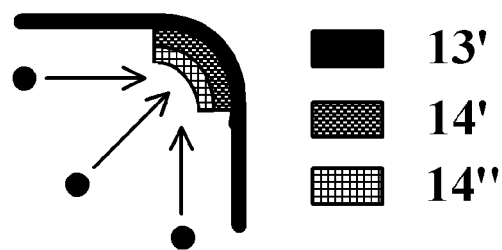
Figure 3:
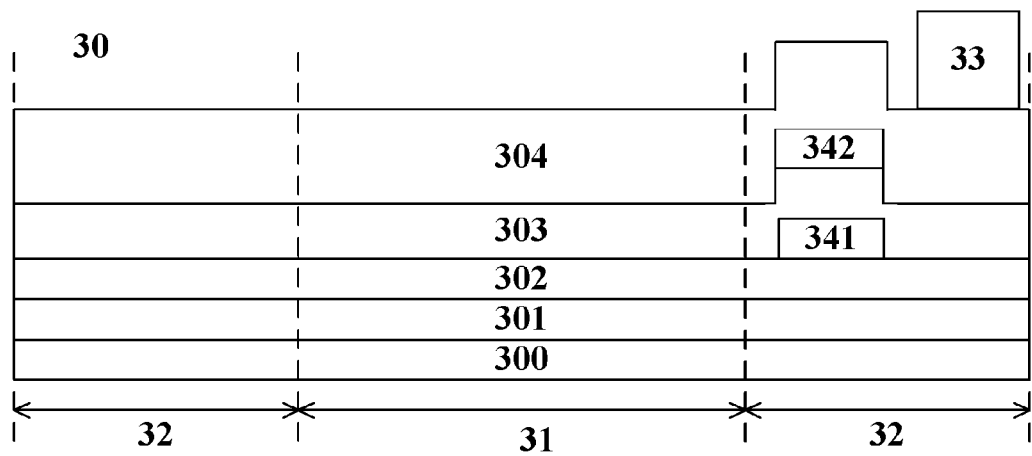
FIG. 3 schematically illustrates a cross-sectional view of the display panel in FIG. 1 along line A-A' according to an embodiment of the present disclosure.

It should be emphasized that although the first barrier structures 13, 13' are illustrated as in direct contact with the second barrier structures 14, 14' in FIG. 1 and FIG. 2(a) to FIG. 2(b) in above-mentioned embodiments, a person skilled in the art should readily contemplate that the two barrier structures 13, 13' and 14, 14' may also be spaced from each other, which facilitates preservation of the ink overflowing from the second barrier structure. For example, as illustrated in FIG. 3, when a process of printing ink is performed in the display region, ink is not desired to overflow from the second barrier structure. However, once ink overflows from the second barrier structure, the first barrier structure 33 can serve to block ink from overflowing so that the overflowing ink remains in the spacing between the first and second barrier structures, thereby effectively avoiding overflowing beyond the edge of the display panel and reducing or even eliminating the influence of the overflowing ink on the display effect.

Figure 2C:
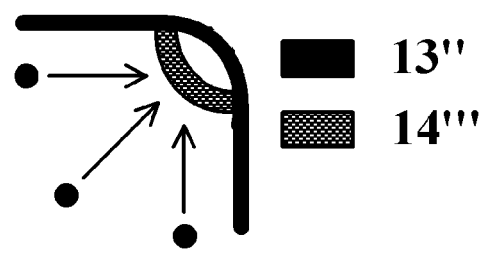

Furthermore, unlike the case illustrated in FIG. 2(a) to FIG. 2(b) in above-mentioned embodiments, according to the alternative embodiment illustrated in FIG. 2(c), the direction in which the second barrier structure 14''' protrudes is opposite to the direction in which the corner circular arc-shaped of the display panel protrudes. That is, in the embodiment illustrated in FIG. 2(c), the extension direction of the second barrier structure 14''' is no longer parallel to the first barrier structure 13'. Even so, the flow of ink can still be effectively blocked in, for example, the three directions illustrated in the figure, thereby achieving a reliable display effect. A person skilled in the art should be able to flexibly design the extension relationship of the first barrier structure and the second barrier structure according to actual needs, and the present disclosure is intended to cover all such equivalent implementations.

In at least some embodiments, the second barrier structure may be formed directly on the surface of the substrate (where "substrate" comprises a base substrate and one or more film layers formed on the base substrate), or the second barrier structure may be formed by raising some film layers on the base substrate so that protrusions are formed on the surface of the substrate. For example, FIG. 6(a) to FIG. 6(d) illustrate examples of forming a second barrier structure by raising a film layer.

Figure 6A:
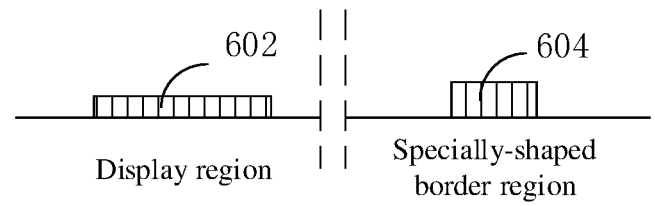
Figure 6B:
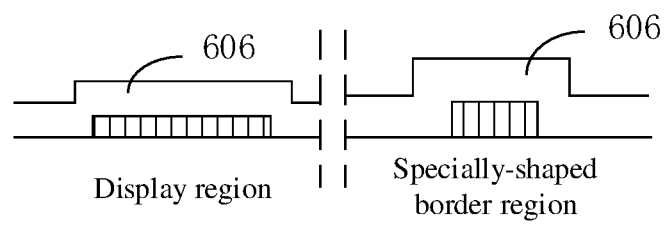

In at least some embodiments, as illustrated in FIG. 6(a), FIG. 6(b) and FIG. 6(d), the display panel further comprises a first film layer 606 located in a specially-shaped border region of the base substrate, and a first barrier structure 600 located above the first film layer 606. The display panel further comprises at least one second barrier structure, for example, the at least one second barrier structure comprises a first raised layer 604 which is located below the first film layer 606 and configured such that a portion of the first film layer 606 thereon protrudes in a direction away from the base substrate. As such, the second barrier structure is formed by raising the first film 606 on the base substrate without separately manufacturing the second barrier structure on the substrate surface, thereby simplifying the manufacturing process and reducing the manufacturing cost.

Figure 6C:
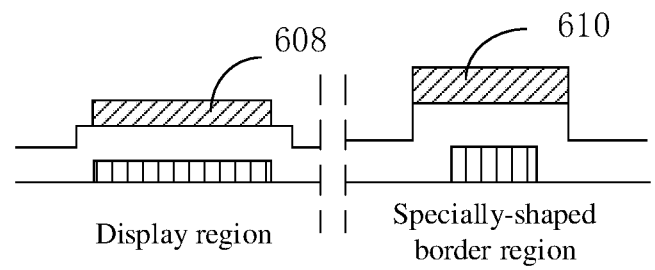

In at least some embodiments, as illustrated in FIG. 6(c) and FIG. 6(d), the display panel further comprises a second film layer 614 located in the specially-shaped border region of the base substrate and above the first film layer 606. The at least one second barrier structure further comprises a second raised layer 610 located below the second film layer 614 and between the first film layer 606 and the second film layer 614, and the second raised layer 610 is configured such that a portion of the second film layer 614 thereon protrudes in a direction away from the base substrate (i.e., a vertically upward direction in FIG. 6(d)). By arranging the two raised layers 604 and 610, the height of the second barrier structure can be flexibly controlled to meet the requirements on different heights of the barrier structure set by people.

In at least some embodiments, as illustrated in FIG. 6(c) and FIG. 6(d), the display panel further comprises at least one storage capacitor 620 which is located in the display region and comprises a first electrode plate 602 and a second electrode plate 612 opposite to each other, herein, the first raised layer 604 and the first electrode plate 602 are located on the same layer and both are in contact with the same layer. As such, the first raised layer 604 can be made of the same conductive material as the first electrode plate 602, and the patterning of the conductive material can be realized by the same patterning process, thus greatly reducing the complexity and cost of the manufacturing process.

In at least some embodiments, as illustrated in FIG. 6(c) and FIG. 6(d), the second raised layer 610 and the second electrode plate 612 are located on the same layer (e.g., the first film layer 606) and both are in contact with the same layer. As such, the second raised layer 610 can be made of the same conductive material as the second electrode plate 612, and the patterning of the conductive material can be realized by the same patterning process, thus greatly reducing the complexity and cost of the manufacturing process. As illustrated in FIG. 6(d), the orthographic projection of the second raised layer 610 on the base substrate and the orthographic projection of the first raised layer 604 on the base substrate overlap with each other.

It can be understood that in all embodiments of the present disclosure, the number of raised layers may be one, two or more, and the number is not specifically limited by the embodiments of the present disclosure. For example, only one raised layer can be used to form the second barrier structure, which can also achieve the object of the present disclosure.

Figure 5:
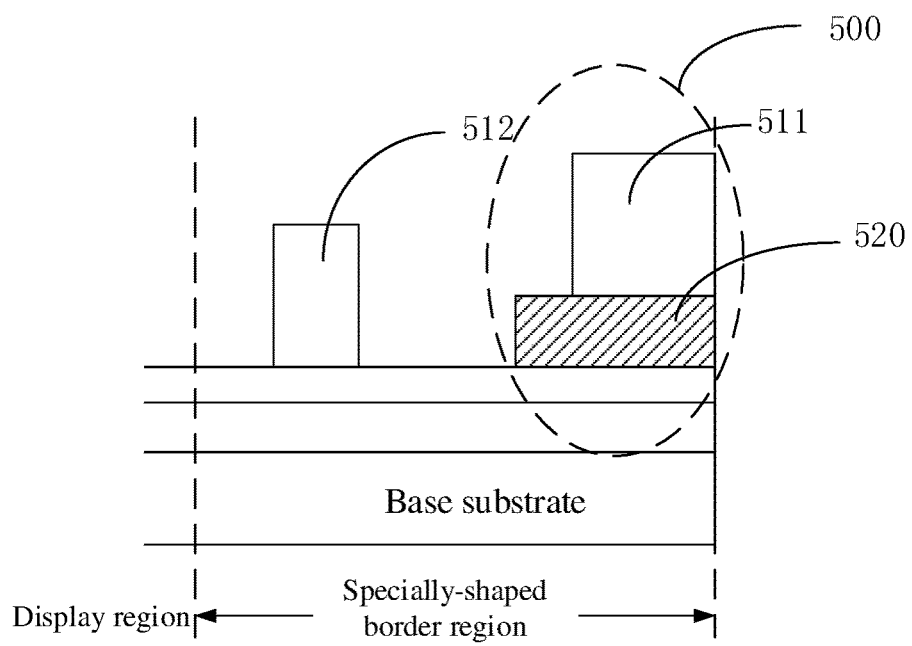
FIG. 5 schematically illustrates a cross-sectional view of a first barrier structure and a second barrier structure according to embodiments of the present disclosure.

FIG. 5 illustrates a method of forming the second barrier structure directly on the surface of the substrate. In all embodiments of the present disclosure, the method of forming the first barrier structure may be the same as or different from the method of forming the second barrier structure, and no further detail will be provided herein.

In at least some embodiments, the display panel further comprises a pixel definition layer and a spacer layer, wherein the first barrier structure is formed by stacking the pixel definition layer and the spacer layer; and the at least one second barrier structure is formed by one of the pixel definition layer and the spacer layer. By using the pixel definition layer and/or spacer layer formed on the surface of the substrate to form the first or second barrier structures, the complexity and cost of the manufacturing process are greatly reduced.

For example, as illustrated in FIG. 5, the display panel further comprises a pixel definition layer and a spacer layer. The pixel definition layer comprises a portion 520 located in a specially-shaped border region. The spacer layer comprises a first portion 511 and a second portion 512, both of which are located in the specially-shaped border region, and the second portion 512 is closer to the display region of the base substrate than the first portion 511. In this case, the portion 520 of the pixel definition layer and the first portion 511 of the spacer layer are stacked on each other to serve as the first barrier structure 500, while only the second portion 512 of the spacer layer serves as the at least one second barrier structure. According to the structure, the first barrier structure and the second barrier structure can be simultaneously formed in the process of forming the spacer layer of the display panel, so that the complexity and cost of the manufacturing process are reduced.

It can be understood that in other embodiments of the present disclosure, the second barrier structure may also be formed when other film layers (e.g., pixel definition layers) are formed. For example, the pixel definition layer comprises a first portion and a second portion, both of which are located in the specially-shaped border region, the second portion being closer to the display region of the base substrate than the first portion. Then, a spacer layer is formed on the pixel definition layer, and a portion of the spacer layer is located in the specially-shaped border region. In this case, the first portion of the pixel definition layer and the portion of the spacer layer are stacked on each other to serve as the first barrier structure, and only the second portion of the pixel definition layer serves as the second barrier structure.

In at least some embodiments, the spacer layer and the pixel definition layer are both made of insulating materials, including organic insulating materials or inorganic insulating materials. For example, the organic insulating materials include acrylic resins and the like, and the inorganic insulating materials include SiNx, SiOx, SiON, AlxOx and the like.

In at least some embodiments, the first and second electrode plates of the storage capacitor are made of conductive materials. For example, the first and second raised layers are made of conductive materials. The conductive material may be a metal conductive material including single metals such as copper (Cu), chromium (Cr), molybdenum (Mo), gold (Au), silver (Ag), platinum (Pt), or alloy materials formed from the above metals, for example, copper-chromium alloy (CuCr) or chromium-molybdenum alloy (CrMo), etc. It can be understood that the first substrate, the second substrate, the first raised layer, and the second raised layer each may be of a single-layer or laminated structure.

Figure 4:
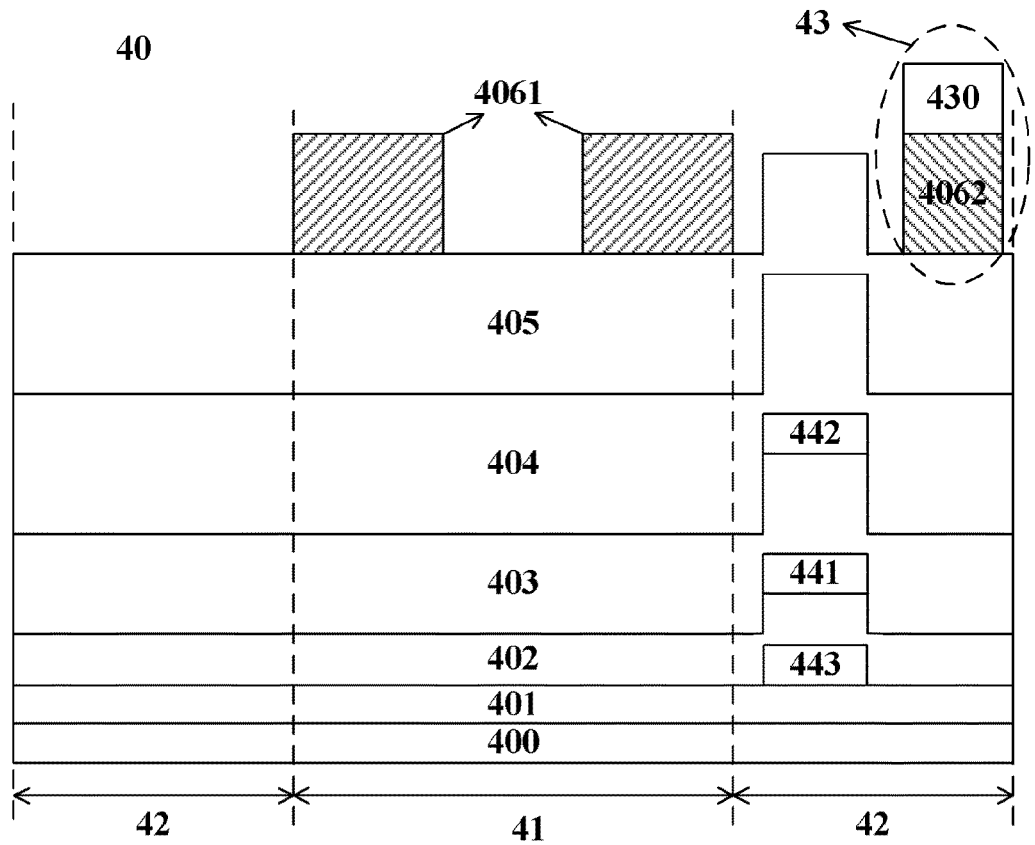
FIG. 4 schematically illustrates a cross-sectional view of the display panel in FIG. 1 along line A-A' according to another embodiment of the present disclosure.

Hereinafter, further detail will be given as to how to form the first barrier structure and the second barrier structure mentioned above in the display panel provided by the embodiments of the present disclosure, with reference to FIG. 3 and FIG. 4. FIG. 3 and FIG. 4 schematically illustrate cross-sectional views of the display panel of FIG. 1 along line A-A', respectively, according to the embodiments of the present disclosure.

As illustrated in FIG. 3, the display panel 30 may comprise a base substrate 300, and a barrier layer 301, a buffer layer 302, a first insulating layer 303, and a second insulating layer 304 sequentially stacked on the base substrate 300 from bottom to top. In addition, in FIG. 3, the display region 31 at the center position of the display panel 30 and the border region 32 at the periphery are also indicated schematically by reference numerals 31, 32 and associated arrows. Of course, it needs to be explained here that in FIG. 3 and FIG. 4 to be described hereinafter, the actual size and/or relative size (e.g., actual/relative height or thickness) of the display region 31 and the border region 32 (as well as any other layers) depicted by way of example and the spacing between any two do not represent any limitation to the present disclosure, and on the contrary, such purpose is only to promote an easier and/or more accurate understanding of the present disclosure by a person skilled in the art.

With further reference to FIG. 3, a first barrier structure 33 is provided in, for example, a border region 32 (corresponding to the upper right corner of the display panel 10 in FIG. 1) on the right side of the display region 31 of the display panel 30. Further, the first barrier structure 33 is disposed at the uppermost of the entire display panel 30, that is, the first barrier structure 33 is disposed on the top surface of the second insulating layer 304. The first barrier structure 33 is close to the right edge of the entire display panel 30 (or the base substrate 300), for example, the first barrier structure 33 is coincident with the right edge of the display panel 30 (not shown in the figure). In addition, as illustrated in FIG. 3, in the hierarchical portion on the left side of the first barrier structure 33 in the display panel 30, the display panel further includes two raised layers 341, 342 which are formed between the buffer layer 302 and the first insulating layer 303 and between the first insulating layer 303 and the second insulating layer 304, respectively, and the two raised layers 341, 342 together constitute the second barrier structure (e.g., the second barrier structure 14 in FIG. 1) as described above. Obviously, as can be seen from FIG. 3, the second barrier structure including the first raised layer 341 and the second raised layer 342 is further away from the right side of the display panel 30 than the first barrier structure 33.

Thus, in the embodiments of the present disclosure, by providing a double barrier structure in the specially-shaped border region 32 of the display panel 30, i.e., the first barrier structure 33 located close to the edge and the second barrier structure (i.e., the first raised layer 341 and the second raised layer 342 in FIG. 3) located close to the display region, a more effective double barrier can be provided for the printing ink in the specially-shaped border region 30, thereby helping to achieve a better blocking effect of the printing ink in the specially-shaped border region 32. Consequently, the stability of the display panel 30 and the corresponding display device can be increased and more excellent display quality can be obtained.

It should be pointed out herein that although the height of the first barrier structure 33 is schematically illustrated to be greater than the height of the entire second barrier structure (i.e., the sum of the heights of the first raised layer 341 and the second raised layer 342) in FIG. 3, that is, the top surface of the second barrier structure is lower than the top surface of the first barrier structure 33 relative to the plane in which the base substrate is located, it doesn't represent any limitation to the embodiment of the present disclosure. Similarly, for the distance between the first barrier structure 33 and the second barrier structure (including the first raised layer 341 and the second raised layer 342), the above case depicted as an example in FIG. 3 represents only one specific implementation, and the present disclosure may include any other suitable different spacing therebetween. Further, a person skilled in the art should readily understand that the same first barrier structure 33 and the same second barrier structure (including the first raised layer 341 and the second raised layer 342) may also be provided in the left specially-shaped border region 32 corresponding to the right specially-shaped border region 32 (corresponding to the lower left corner of the display panel 10 in FIG. 1), and the present disclosure is intended to cover all these equivalent implementations.

As a specific implementation, in the embodiments of the present disclosure, the first raised layer 341 and the second raised layer 342 of the first barrier structure as illustrated in FIG. 3 may be formed in the same layer as the two electrode plates of the capacitor in the display region of the display panel 30, respectively. This also means that the first barrier structure, i.e., the first raised layer 341 and the second raised layer 342, may be formed by means of a metal material. In this way, the manufacturing process of the entire display panel 30 can be simplified, that is, a separate manufacturing process for the barrier structure (in particular, the second barrier structure) is not required. Further optionally, in such embodiments, the first insulating layer 303 may include, for example, a gate electrode insulating layer, and the second insulating layer 304 may include, for example, an interlayer insulating layer. Of course, a person skilled in the art, having benefited from the teachings of the present disclosure, should readily contemplate that the first raised layer and/or the second raised layer can also be simultaneously obtained by a process for forming other hierarchical structures in the display panel, and thus, such raised layers can also be formed using any suitable material, for example, an inorganic material.

Next, referring to FIG. 4, a cross-sectional view of the display panel according to another embodiment of the present disclosure along line A-A' in FIG. 1 is further described. The display panel 40 illustrated in FIG. 4 has substantially the same configuration as the display panel 30 in FIG. 3, and therefore, similar reference numerals are used to indicate similar components. For example, on the base substrate 400 of the display panel 40 illustrated in FIG. 4, a barrier layer 401, a buffer layer 402, a first insulating layer 403 and a second insulating layer 404 are respectively provided from bottom to top. In addition, in the display panel 40 illustrated in FIG. 4, a first raised layer 441 and a second raised layer 442 are similarly provided. Herein, the first raised layer 441 is located between the buffer layer 402 and the first insulating layer 403, and the second raised layer 442 is located between the first insulating layer 403 and the second insulating layer 404. The two raised layers in FIG. 4, i.e., the first raised layer 441 and the second raised layer 442, are similar to the first raised layer 341 and the second raised layer 342 in FIG. 3, respectively, and therefore will not be further described in detail herein.

Being different from the display panel 30 in FIG. 3, the display panel 40 in FIG. 4 may further include a metal layer 405 and an additional raised layer 443. The metal layer 405 is provided between the second insulating layer 404 and the first barrier structure 43, and the additional raised layer 443 is located between the barrier layer 401 and the buffer layer 402. By comparing the embodiments in FIG. 3 and FIG. 4, it can be seen that with the introduction of a greater number of raised layers, a greater height can be provided for the second barrier structure closer to the display region. Therefore, this will help to achieve a better blocking effect against printing ink, thereby realizing more stable display and/or more favorable display performance of the display panel and the display device comprising the display panel.

Further optionally, as illustrated in FIG. 4, in the embodiments of the present disclosure, the display panel 40 may further comprise a pixel definition layer, and the pixel definition layer is disposed on a surface of the metal layer 405 away from the second insulating layer 404, that is, at an top surface of the metal layer 405. Further, referring to FIG. 4, the pixel definition layer may include a first portion 4061 located in the display region 41 and a second portion 4062 located in the border region 42. It should be noted herein that although the pixel definition layer is illustrated to include the first portion 4061 located in the display region 41 and the second portion 4062 located in the right-side border region 42 in FIG. 4, this does not represent any limitation to the present disclosure. In fact, according to specific practices and requirements, a person skilled in the art may further provide another second portion 4062 of the pixel definition layer in the corresponding left border region 42, and all such alternative implementations should fall within the scope of protection of the present disclosure. In addition, it should also be pointed out that, for the purpose of clarity of the drawings, the first portion 4061 of the pixel definition layer associated with one pixel unit is schematically drawn in FIG. 4 by way of example only. A person skilled in the art should be able to clearly realize that in the display region 41 of the display panel 40 provided by the embodiments of the present disclosure, the first portion 4061 of the pixel definition layer may include a repeating array arrangement of unit structures as illustrated in FIG. 4, wherein each unit structure is associated with one pixel unit.

Further optionally, in the above-described specific examples of the embodiments, the first barrier structure 43 located adjacent to the edge of the display panel 40 (or the edge of the base substrate 400) can be obtained by sequentially forming the spacer 430 on the second portion 4062 of the pixel definition layer. That is to say, in the display panel 40 provided by the embodiments of the present disclosure, the first barrier structure 43 may include two sub-layers which are stacked. For example, as illustrated in FIG. 4, the first barrier structure 43 may include a second portion 4062 of the pixel definition layer located in a lower layer and a spacer 432 located in an upper layer. In this way, the first barrier structure 43 can be at least partially formed at the time of forming the pixel definition layer during the entire manufacturing process of the display panel 40. On one hand, this will simplify the manufacturing of the first barrier structure 43, i.e., it does not require too many additional operations for forming the first barrier structure 43 separately; on the other hand, this also helps to reduce the manufacturing cost associated with the first barrier structure 43 and the entire display panel 40.

According to another aspect of the present disclosure, there is further provided a display device, comprising the display panel described in any one of the above embodiments. By way of example, the display device may be any suitable component having a display function, including, but not limited to, a cellphone, a computer, a tablet PC, a television, a monitor, a digital photo frame, or the like. Such a display device has identical or similar functions to the display panel described above, and can realize identical or similar beneficial technical effects. For the purpose of simplicity, the display device will not be repeatedly described herein.

According to still another aspect of the present disclosure, there is further provided a method of manufacturing a display panel, as illustrated in FIG. 7, comprising: providing a base substrate, herein, the base substrate comprises a display region and a border region surrounding the display region, and the border region comprises a specially-shaped border region; forming a first barrier structure in at least the specially-shaped border region; and forming at least one second barrier structure only in the specially-shaped border region.

In the method of manufacturing the display panel of the above embodiments, the second barrier structure is arranged in the specially-shaped border region to form a double barrier, so that the ability of the specially-shaped border region to block overflow of liquids such as ink is enhanced, thereby ensuring the normal display of the display panel.

In at least some embodiments, the at least one second barrier structure is formed by raising a film layer on the base substrate such that a portion of the film layer forms a protrusion.

For example, as illustrated in FIG. 6(a), FIG. 6(b) and FIG. 6(d), the method further comprises: forming a first film layer 606 in the specially-shaped border region of the base substrate, and the first barrier structure 600 is formed on the first film layer 606. The forming at least one second barrier structure only in the specially-shaped border region comprises: forming a first raised layer 604 below the first film layer 606, and the first raised layer 604 is configured such that a portion of the first film layer 606 thereon protrudes in a direction away from the base substrate.

For example, as illustrated in FIG. 6(c) and FIG. 6(d), the method further comprises: forming a second film layer 614 in the specially-shaped border region of the base substrate, the second film layer 614 being located above the first film layer 606; herein, the forming at least one second barrier structure only in the specially-shaped border region further comprises: forming a second raised layer 610 below the second film layer 614, and the second raised layer 610 is located between the first film layer 606 and the second film layer 614 and configured such that a portion of the second film layer 614 thereon protrudes in a direction away from the base substrate.

For example, as illustrated in FIG. 6(a) to FIG. 6(d), the method further comprises: forming at least one storage capacitor 620 in the display region, the at least one storage capacitor 620 comprising a first electrode plate 602 and a second electrode plate 612 opposite to each other. As illustrated in FIG. 6(a), the first electrode plate 602 and the first raised layer 604 are formed in the same patterning process, and the first raised layer is formed of the same conductive material as the first electrode plate. In the embodiments of the present disclosure, the patterning process includes, but is not limited to, a photolithography process. For example, the photolithography process generally comprises: forming a photoresist on a film layer to be patterned; exposing the photoresist by using a mask plate; developing the photoresist; etching part of the film layer to be patterned; and peeling off the remaining photoresist.

For example, as illustrated in FIG. 6(c), the second raised layer 610 and the second electrode plate are formed in the same patterning process and are formed of the same conductive material. For example, the orthographic projection of the second raised layer 610 on the base substrate and the orthographic projection of the first raised layer 604 on the base substrate overlap with each other.

In at least some embodiments, the at least one second barrier structure is directly formed by a film layer on the base substrate.

For example, the method further comprises: forming a pixel definition layer and a spacer layer on the base substrate, herein, the at least one second barrier structure is directly formed by one of the pixel definition layer and the spacer layer.

For example, as illustrated in FIG. 5, the spacer layer is formed on the pixel definition layer, and the pixel definition layer has a portion 520 located in the specially-shaped border region. The spacer layer comprises a first portion 511 and a second portion 512 which are located in the specially-shaped border region, the second portion 512 being closer to the display region of the base substrate than the first portion 511. Herein, the portion 520 of the pixel definition layer and the first portion 511 of the spacer layer are stacked on each other to serve as the first barrier structure 500, and only the second portion 512 of the spacer layer serves as the second barrier structure. It can be understood that the display region generally comprises a plurality of pixel regions, each pixel region is provided with a display unit, and the pixel definition layer further comprises another portion (not shown) formed in the display region for defining the plurality of pixel regions.

It can be understood that in other embodiments of the present disclosure, the second barrier structure may also be formed at the time of forming other film layers (e.g., pixel definition layers). For example, the pixel definition layer includes a first portion and a second portion located in the specially-shaped border region, the second portion being closer to the display region of the base substrate than the first portion. Then, a spacer layer is formed on the pixel definition layer, and a portion of the spacer layer is located in the specially-shaped border region. In this case, the first portion of the pixel definition layer and the portion of the spacer layer are stacked on each other to serve as the first barrier structure, and only the second portion of the pixel definition layer serves as the second barrier structure.

The following points need to be explained herein:

(1) The drawings of the embodiments of the present disclosure only relate to the structures involved in the embodiments of the present disclosure, and for other structures, reference may be made to common designs.

(2) For the purpose of clarity only, in the drawings used to describe the embodiments of the present disclosure, the thickness of layers or regions is zoomed in or out, i.e., these drawings are not drawn according to actual scale.

(3) Without conflict, the embodiments of the present disclosure and the features in the embodiments can be combined with each other to obtain new embodiments.

The above description is merely an exemplary embodiment of the present disclosure and is not intended to limit the scope of protection of the present disclosure, which is determined by the appended claims.

What is claimed is:

1. A display panel, comprising:
   a base substrate, comprising a display region and a border region surrounding the display region, the border region comprising a specially-shaped border region;
   a first barrier structure configured to be disposed in at least the specially-shaped border region;
   at least one second barrier structure configured to be disposed only in the specially-shaped border region; and
   a first film layer located in the specially-shaped border region of the base substrate, the first barrier structure being located above the first film layer, the at least one second barrier structure comprising a first raised layer located below the first film layer, the first raised layer being configured such that a portion of the first film layer thereon protrudes in a direction away from the base substrate.

2. The display panel according to claim 1, wherein the first barrier structure is closer to an edge of the base substrate than the at least one second barrier structure.

3. The display panel according to claim 1, further comprising:
   a second film layer located in the specially-shaped border region of the base substrate and above the first film layer,
   wherein the at least one second barrier structure further comprises a second raised layer, the second raised layer is located below the second film layer and between the first film layer and the second film layer, and the second raised layer is configured such that a portion of the second film layer thereon protrudes in the direction away from the base substrate.

4. The display panel according to claim 3, further comprising:
   at least one storage capacitor located in the display region and comprising a first electrode plate and a second electrode plate opposite to each other,
   wherein the first raised layer and the first electrode plate are located on a same layer and both are in contact with the same layer.

5. The display panel according to claim 4, wherein the second raised layer and the second electrode plate are located on a same layer and both are in contact with the same layer, and an orthographic projection of the second raised layer on the base substrate and an orthographic projection of the first raised layer on the base substrate overlap with each other.

6. The display panel according to claim 1, further comprising:
   a pixel definition layer and a spacer layer,
   wherein the first barrier structure is formed by stacking the pixel definition layer and the spacer layer; and the at least one second barrier structure is formed by one of the pixel definition layer and the spacer layer.

7. The display panel according to claim 1, wherein the first barrier structure and the at least one second barrier structure are both parallel to a same edge of the base substrate.

8. The display panel according to claim 1, wherein a top surface of the at least one second barrier structure is lower than a top surface of the first barrier structure relative to a plane where the base substrate is located, and a spacing is provided between the at least one second barrier structure and the first barrier structure.

9. A display device, comprising the display panel according to claim 1.

10. A method of manufacturing a display panel, comprising:
    providing a base substrate, the base substrate comprising a display region and a border region surrounding the display region, and the border region comprising a specially-shaped border region;
    forming a first barrier structure in at least the specially-shaped border region; and
    forming at least one second barrier structure only in the specially-shaped border region; and
    forming a first film layer in the specially-shaped border region of the base substrate,
    wherein the first barrier structure is formed on the first film layer, and
    wherein the forming at least one second barrier structure only in the specially-shaped border region comprises: forming a first raised layer below the first film layer, the first raised layer being configured such that a portion of the first film layer thereon protrudes in a direction away from the base substrate.

11. The method according to claim 10, wherein the at least one second barrier structure is formed by raising a film layer on the base substrate such that a portion of the film layer forms a protrusion.

12. The method according to claim 10, further comprising:
    forming a second film layer in the specially-shaped border region of the base substrate, the second film layer being located above the first film layer,
    wherein the forming at least one second barrier structure only in the specially-shaped border region further comprises: forming a second raised layer below the second film layer, the second raised layer being located between the first film layer and the second film layer and being configured such that a portion of the second film layer thereon protrudes in the direction away from the base substrate.

13. The method according to claim 12, further comprising:
    forming at least one storage capacitor in the display region, the at least one storage capacitor comprising a first electrode plate and a second electrode plate opposite to each other,
    wherein the first electrode plate and the first raised layer are formed in a same patterning process and are formed of a same conductive material.

14. The method according to claim 13, wherein the second raised layer and the second electrode plate are formed in a same patterning process and are formed of a same conductive material, and an orthographic projection of the second raised layer on the base substrate and an orthographic projection of the first raised layer on the base substrate overlap with each other.

15. The method according to claim 10, wherein the at least one second barrier structure is directly formed by a film layer on the base substrate.

16. The method according to claim 15, further comprising:
   forming a pixel definition layer and a spacer layer on the base substrate,
   wherein the at least one second barrier structure is directly formed by one of the pixel definition layer and the spacer layer.

17. The method according to claim 16, wherein the spacer layer is formed above the pixel definition layer, a portion of the pixel definition layer is located in the specially-shaped border region, the spacer layer comprises a first portion and a second portion, the first portion and the second portion are located in the specially-shaped border region, and the second portion of the spacer layer is closer to the display region of the base substrate than the first portion,
   wherein the portion of the pixel definition layer and the first portion of the spacer layer are stacked on each other to serve as the first barrier structure, and only the second portion of the spacer layer serves as the at least one second barrier structure.

* * * * *